(12) United States Patent
Burns et al.

(10) Patent No.: US 7,073,667 B2
(45) Date of Patent: Jul. 11, 2006

(54) PHOTOCHROMIC SUBSTRATE CONTAINER

(75) Inventors: John Burns, Colorado Springs, CO (US); Matthew A. Fuller, Colorado Springs, CO (US); Jeffery J. King, Colorado Springs, CO (US); Martin L. Forbes, Divide, CO (US); Mark V. Smith, Colorado Springs, CO (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/971,556

(22) Filed: Oct. 22, 2004

(65) Prior Publication Data

US 2005/0139511 A1    Jun. 30, 2005

Related U.S. Application Data

(60) Provisional application No. 60/514,164, filed on Oct. 24, 2003.

(51) Int. Cl.
*B65D 85/30* (2006.01)
*B65D 85/48* (2006.01)

(52) U.S. Cl. .................... 206/710; 206/454; 206/459.1

(58) Field of Classification Search ............. 206/459.1, 206/459.5, 308.1, 308.2, 454, 710–712
See application file for complete search history.

(56) References Cited

U.S. PATENT DOCUMENTS

| | | | |
|---|---|---|---|
| 2,753,460 A | 7/1956 | Reed et al. | |
| 5,959,761 A | 9/1999 | Perrott et al. | |
| 5,975,696 A | 11/1999 | Kohan | |
| 6,098,809 A | 8/2000 | Okada et al. | |
| 6,378,906 B1 * | 4/2002 | Pennaz | 206/459.1 |
| 6,405,867 B1 * | 6/2002 | Moore | 206/459.1 |
| 6,543,617 B1 | 4/2003 | Angelopoulos et al. | |
| 6,698,590 B1 * | 3/2004 | Moore | 206/459.1 |
| 6,726,013 B1 * | 4/2004 | Pennaz | 206/459.1 |
| 2004/0008613 A1 * | 1/2004 | Beckwith et al. | 206/308.2 |

* cited by examiner

*Primary Examiner*—Bryon P. Gehman
(74) *Attorney, Agent, or Firm*—Patterson, Thuente, Skaar & Christensen, P.A.

(57) ABSTRACT

A semiconductor wafer, substrate, or reticle storage or shipping device that includes a photochromic indicator of exposure to undesired electromagnetic radiation. The present invention includes the incorporation of a photochromic material into the plastic used to fabricate at least a portion of a semiconductor wafer, disk, or reticle shipping or storage containers. The container may include photochromic material in the form of a transparent window or a larger portion of the container. The photochromic material may change color or darkness in response to exposure to a selected range of wavelengths of light.

23 Claims, 2 Drawing Sheets

PHOTOCHROMIC SUBSTRATE CONTAINER

This application claims the benefit of U.S. Provisional Application Ser. No. 60/514,164 filed Oct. 24, 2003, the same being incorporated herein by reference.

FIELD OF THE INVENTION

The invention relates to wafers containers for transport, shipping and storage of substrates.

BACKGROUND OF THE INVENTION

During processing semi-conductor wafers are subjected to numerous process steps in various machines and at various locations. The wafers must be transported from workstation to workstation and from facility to facility to accomplish these various steps. Numerous types of shipping devices are known for handling storing and shipping semi-conductor wafers. In general, such devices hold the wafers in axially aligned arrays. Where wafers are shipped from facility to facility the wafers may be exposed to sunlight for significant periods of time. Sunlight includes substantial amounts of electromagnetic radiation in the ultraviolet wavelengths. Wafer containers may also be exposed to ultraviolet light from other sources.

Current, state of the art, semi-conductor lithography production processes use deep ultraviolet lasers to image circuits with critical features ranging in size as small as one hundred thirty to one hundred fifty nanometers. It is expected that in the near future critical features may shrink to a size range of about seventy nanometers.

In the production process wafers are spin coated with a photoresist. The photoresist is then baked to adhere it to the wafer. Next, an image of the desired circuitry is projected onto the wafer using electromagnetic radiation. Today, this is commonly deep ultraviolet radiation from a laser. The photoresist material is chemically altered by exposure to ultraviolet light to create either a negative or positive image of the circuit depending on the process used. The undesired photoresist material is then etched away leaving an integrated circuit pattern on the wafer.

As discussed above, photoresists that are used in semi-conductor processes are sensitive to light in the ultraviolet wavelengths. Because of the tiny size of the critical elements of modern integrated circuits only a very small exposure to uncontrolled ultraviolet radiation can lead to spoilage of a wafer. Consequently, it is desirable, in the production process, that photoresists only be exposed to the ultraviolet wave lengths of light under carefully controlled conditions. Unintended exposure will destroy the usability of wafers exposed.

Thus, wafer shipping containers used in the handling, storing and shipping of wafers are made of materials, typically plastics, that block ultraviolet light to prevent it from affecting wafers coated with photoresist material. It is also desirable that wafer shipping containers be, at least partially transparent to visible light to allow workers to determine whether a shipping container is empty or full. Thus, shipping containers have been made of materials that are transparent, at least in part, to visible light but that are relatively opaque to ultraviolet light.

Nonetheless, ultraviolet blocking is never absolute and it is desirable to expose wafer containers to ultraviolet radiation as little as possible. Thus, it would be a benefit to the semiconductor industry if wafer containers themselves could signal to workers that the wafer container was currently exposed to ultraviolet radiation. This would signal the worker to move the wafer container to an ultraviolet sheltered location.

Additionally, similar issues exist with regard to the storage and processing the disks for computer hard drives and the reticles for the lithography operations.

SUMMARY OF THE INVENTION

The present invention solves the above problem by providing a semiconductor wafer, substrate, or reticle storage or shipping device that includes a photochromic indicator of ultraviolet exposure.

Photochromic materials darken when exposed to sunlight or another source of ultraviolet radiation. Photochromic material transitions between two different states. A low energy state in which the material is clear, uncolored and an activated state in which the material is colored. When electromagnetic radiation of an appropriate energy level impinges on the photochromic material.

The present invention includes the incorporation of a photochromic material into the plastic used to fabricate semiconductor wafer, disk, or reticle shipping or storage containers.

In operation, the photochromic container is used to transport and store semiconductor wafers in a similar fashion to any other semiconductor shipping container. However, if the container is left exposed to sunlight or another source of ultraviolet radiation that may, with sufficient time, have an affect on the photoresist layer which is sensitive to ultraviolet radiation, the shipping container will darken in color. This darkening in color will provide an immediate indication to the shipping workers that the containers are being exposed to ultraviolet light and should be removed from the situation as soon as possible to avoid having a negative affect on the photoresist materials.

It is known in the prior art to introduce organic molecules exhibiting photochromic properties into a number of light-transmissible articles.

The fabrication of photochromic polymers is known in the polymer arts. Some available options for introducing dyes into a polymer article, such as a wafer carrier, are, for example: (1) Impregnation or imbibing from a fluid medium contacting the surface of the polymer, (2) Incorporation of the dye in a resin coating applied to the surface; (3) Impregnation or diffusive transfer from a solid or gel in contact with the polymer surface, (4) Dispersion of the dye in the monomer or thermoplastic from which the article is to be fabricated.

In operation, the photochromic container is used to transport and store semiconductor wafers, disks, or reticles in a similar fashion to any other known substrate container. However, if the container is left exposed to sunlight or another source of ultraviolet radiation that may, with sufficient time, have an affect on the photoresist layer which is sensitive to ultraviolet radiation, the shipping container will darken in color. This darkening in color can provide an immediate indication to the shipping workers that the containers are being exposed to ultraviolet light and should be removed from the situation as soon as possible to avoid having a negative affect on the photoresist materials. Additionally, the darkening in color can provide the functional effect of reducing the UV entering the container.

DETAILED DESCRIPTION OF THE INVENTION

Figure 1:
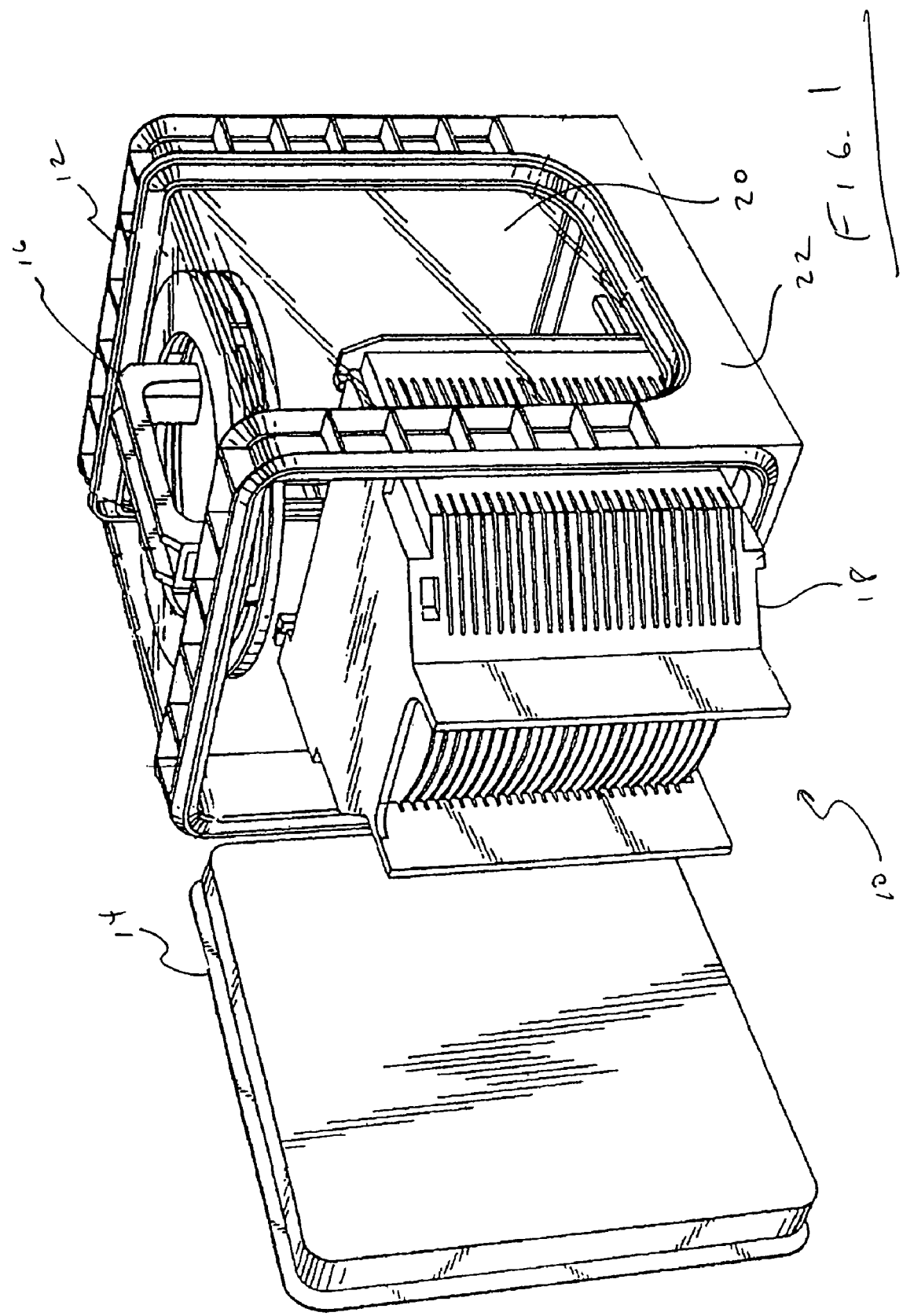
FIG. 1 depicts an exemplary partially transparent wafer container.

Referring to FIG. 1, a partially transparent wafer container 10 generally includes a case 12 and a door 14. Case 12 includes a handle 16 for use in carrying and encloses a wafer holder 18. Wafer holder 18 is adapted to support a number of wafers in axially aligned arrays.

In this example, case 12 includes a transparent portion 20 and opaque portion 22. Preferably, transparent portion 20 is formed of a photochromic material that will change color or darkness upon expose to ultraviolet light. Transparent portion 20 may also be a portion of door 14 or a smaller window into wafer container 10.

Figure 2:
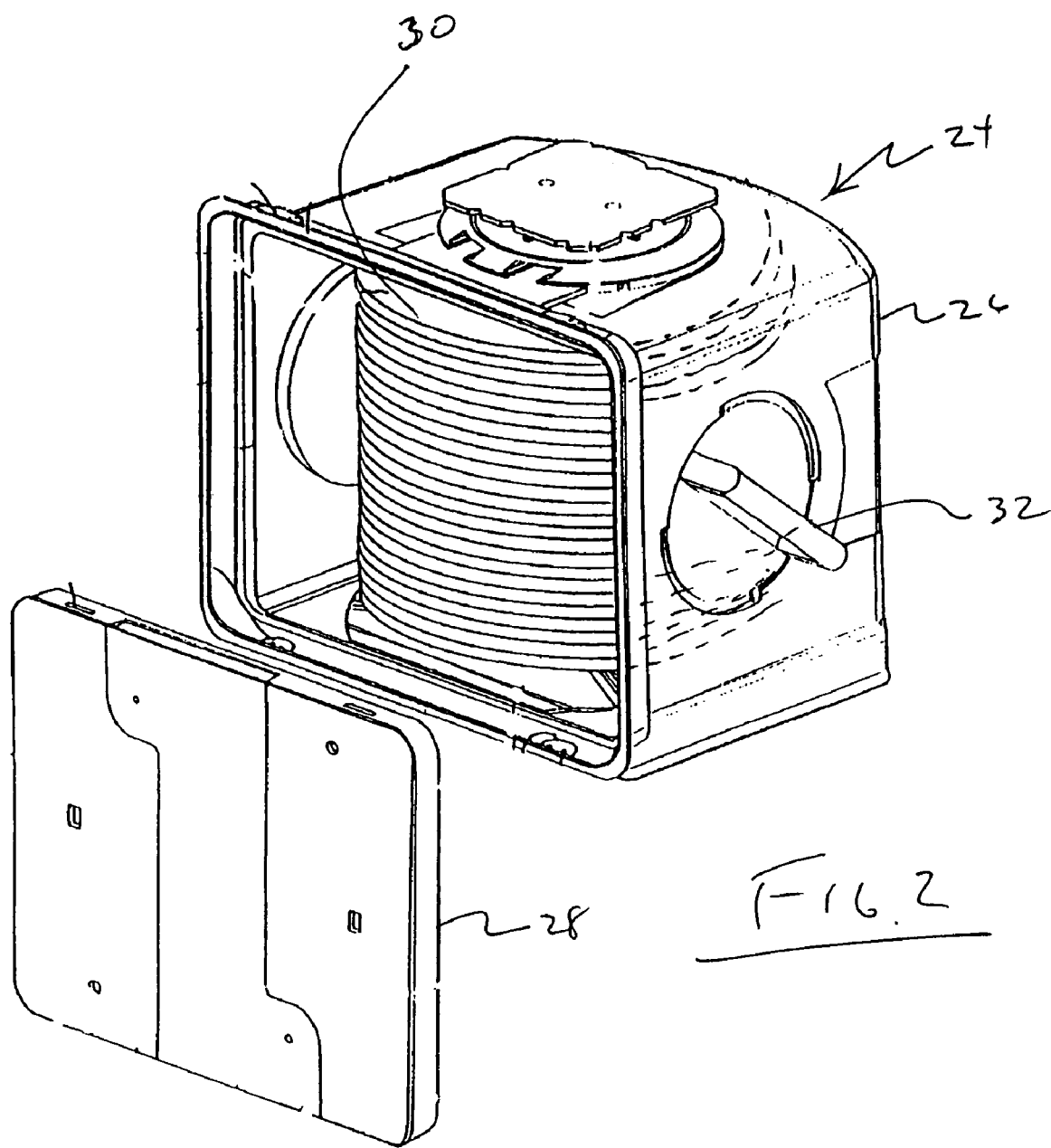
FIG. 2 depicts an exemplary substantially transparent wafer container.

Referring now to FIG. 2, substantially transparent wafer container 24 generally includes a case 26 and a door 28. Wafer container 24 encloses wafer array 30 which includes a plurality of wafers axially arrayed. Either case 26 or door 28 may support handle 32. In this exemplary embodiment, wafer container 24 is substantially transparent throughout a large portion of its construction. At least a portion of wafer container 24 is made from a photochromic material that changes color or darkness in response to exposure to ultraviolet light.

In operation, partially transparent wafer container 10 or substantially transparent wafer container 24 are used to transport wafers between work sites. If either partially transparent wafer container 10 or substantially transparent wafer container 24 are exposed to ultraviolet light for a significant period of time, the photochromic portions of the containers will darken or change color to signal this to the workers handling the containers. Thus, a worker having received this readily obvious signal indicating exposure to ultraviolet light can alter the location of the containers in order to prevent signification ultraviolet exposure leading to harm of the wafers or the darkening itself may reduce the entry UV radiation and prevent or minimize damage to the substrate or reticles.

The invention includes photochromatic materials in reticle carriers. Reticle carriers are illustrated in U.S. Pat. Nos. 6,513,654 and 6,216,873 which are incorporated by reference. Similarly, the invention includes disk shippers such as illustrated in U.S. Pat. Nos. 4,557,382 and 5,253,755 and incorporated herein by reference.

The present invention may be embodied in other specific forms without departing from the central attributes thereof, therefore, the illustrated embodiments should be considered in all respects as illustrative and not restrictive, reference being made to the appended claims rather than the foregoing description to indicate the scope of the invention.

What is claimed is:

1. A carrier for transporting multiple similar semiconductor wafers, disks, or reticles, comprising:

a container comprising an openable enclosure, the container being formed to support, structurally separate, enclose and protect the multiple similar semiconductor wafers, disks, or reticles; and an at least partially transparent portion at least partially formed of a photochromic material that changes color or darkness in response to exposure to electromagnetic radiation of one of a selected wavelength or range of wavelengths.

2. The carrier as claimed in claim 1, in which the container comprises a case and a door.

3. The carrier as claimed in claim 2, in which the at least partially transparent portion is a part of the case.

4. The carrier as claimed in claim 2, in which the at least partially transparent portion is a part of the door.

5. The carrier as claimed in claim 2, in which substantially the entire door is formed of the photochromic material.

6. The carrier as claimed in claim 2, in which substantially the entire case is formed of the photochromic material.

7. The carrier as claimed in claim 1, in which the selected wavelength or range of wavelengths comprises ultraviolet light.

8. The carrier as claimed in claim 1, in which the selected wavelength or range of wavelengths comprises deep ultraviolet light.

9. The carrier as claimed in claim 1, in which a window in the carrier is formed of the photochromic material.

10. A method for determining if a carrier for transporting semiconductor wafers, disks, or reticles is exposed to undesired electromagnetic radiation comprising the steps of:

placing a plurality of similar semiconductor wafers, disks, or reticles in a container comprising an openable enclosure, the container being formed to separately support, enclose and protect the plurality of similar semiconductor wafers, discs, or reticles; and an at least partially transparent portion at least partially formed of a photochromic material that changes color or darkness in response to exposure to electromagnetic radiation of one of a selected wavelength or range of wavelengths;

transporting the container; and observing the photochromic material to discern any change in color or darkness.

11. The method as claimed in claim 10, further comprising the step of selecting the wavelength or range of wavelengths to include ultraviolet light.

12. The method as claimed in claim 10, further comprising the step of selecting the wavelength or range of wavelengths to include deep ultraviolet light.

13. The method as claimed in claim 10, in which the container comprises a case and a door.

14. The method as claimed in claim 13, in which the at least partially transparent portion is a part of the case.

15. The method as claimed in claim 13, in which the at least partially transparent portion is a part of the door.

16. A method for protecting semiconductor wafers, disks, or reticles from exposure to undesired electromagnetic radiation comprising the steps of:

placing the semiconductor wafers, discs, or reticles in a container comprising an openable enclosure, forming the container to support, enclose and protect the semiconductor wafers, discs, or reticles; and forming the container to include an least partially transparent portion at least partially formed of a photochromic material that changes color or darkness in response to exposure to electromagnetic radiation of one of a selected wavelength or range of wavelengths.

17. The method as claimed in claim 16, further comprising the step of selecting the photochromic material such that it changes color or darkens to absorb or reflect the undesired electromagnetic radiation.

18. The method as claimed in claim 16, further comprising the steps of observing the photochromic material to discern whether a change in color or darkness has occured; and acting to remove the container from the exposure to undesired electromagnetic radiation in response to the change in color or darkness.

19. The method as claimed in claim 16, further comprising the step of selecting the wavelength or range of wavelengths to include ultraviolet light.

20. The method as claimed in claim 16, further comprising the step of selecting the wavelength or range of wavelengths to include deep ultraviolet light.

21. The method as claimed in claim 16, in which the container comprises a case and a door.

22. The method as claimed in claim 21, in which the at least partially transparent portion is a part of the case.

23. The method as claimed in claim 21, in which the at least partially transparent portion is a part of the door.

* * * * *